(12) United States Patent
Delano et al.

(10) Patent No.: US 7,733,178 B1
(45) Date of Patent: Jun. 8, 2010

(54) HIGH EFFICIENCY AUDIO AMPLIFIER

(75) Inventors: Cary L. Delano, Los Altos, CA (US);
Brian B. North, Los Gatos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 36 days.

(21) Appl. No.: 12/257,287

(22) Filed: Oct. 23, 2008

Related U.S. Application Data

(60) Provisional application No. 60/982,358, filed on Oct. 24, 2007.

(51) Int. Cl.
H03F 3/217 (2006.01)
(52) U.S. Cl. .................................. 330/251; 330/207 A
(58) Field of Classification Search ................. 330/251, 330/207 A, 297
See application file for complete search history.

(56) References Cited

U.S. PATENT DOCUMENTS

| | | | |
|---|---|---|---|
| 4,030,045 A | 6/1977 | Clark | |
| 4,324,950 A | 4/1982 | Strickland | |
| 5,038,325 A | 8/1991 | Douglas et al. | |
| 5,072,171 A | 12/1991 | Eng | |
| 5,115,203 A | 5/1992 | Krett et al. | |
| 5,347,171 A | 9/1994 | Cordoba et al. | |
| 5,491,839 A | 2/1996 | Schotz | |
| 5,694,072 A | 12/1997 | Hsiao | |
| 6,107,886 A | 8/2000 | Kusakabe | |
| 6,215,356 B1 | 4/2001 | Servaes et al. | |
| 6,256,482 B1 | 7/2001 | Raab | |
| 6,304,138 B1 | 10/2001 | Johnson | |
| 6,323,729 B1 | 11/2001 | Sevenhans et al. | |
| 6,417,736 B1 | 7/2002 | Lewyn | |
| 6,486,733 B2 | 11/2002 | Myers et al. | |
| 6,504,426 B2 | 1/2003 | Picha et al. | |
| 6,538,514 B2 | 3/2003 | Harvey | |
| 6,614,310 B2 | 9/2003 | Quarfoot et al. | |
| 6,636,103 B2 | 10/2003 | Wurcer et al. | |
| 6,639,815 B1 * | 10/2003 | Gucyski | 363/40 |
| 6,815,988 B2 | 11/2004 | Sanduleanu | |
| 6,836,095 B2 * | 12/2004 | Fogg | 320/128 |

(Continued)

FOREIGN PATENT DOCUMENTS

WO    WO 97/23005 A1    6/1997

(Continued)

OTHER PUBLICATIONS

"TDA7563 Multifunction Quad Power Amplifier with Built-In Diagnostics Features," May 2003. ST Microelectronics.

(Continued)

Primary Examiner—Henry K Choe
(74) Attorney, Agent, or Firm—Schwegman, Lundberg & Woessner, P.A.

(57) ABSTRACT

According to the invention, an audio amplifier system for use with a single-ended portable power supply that is referenced to ground, such as a small battery, has a single-channel class G amplifier section, a multiple voltage output charge pump subsystem for supplying complementary pairs of power supply voltages at selected ratiometric levels to an amplifier section, a set of switches on the power supply rails and a power-measuring comparator for selecting which complementary pair of power supply voltages is provided to the amplifier section.

6 Claims, 3 Drawing Sheets

U.S. PATENT DOCUMENTS

| | | | |
|---|---|---|---|
| 6,838,942 B1 | 1/2005 | Somerville et al. |
| 6,853,244 B2 | 2/2005 | Robinson et al. |
| 6,975,175 B2 | 12/2005 | Sanduleanu |
| 6,982,600 B2 | 1/2006 | Harvey |
| 6,987,417 B2 | 1/2006 | Winter et al. |
| 6,993,302 B2 | 1/2006 | Bausov et al. |
| 6,998,914 B2 | 2/2006 | Robinson |
| 7,026,868 B2 | 4/2006 | Robinson et al. |
| 7,034,614 B2 | 4/2006 | Robinson et al. |
| 7,042,284 B2 | 5/2006 | Moons et al. |
| 7,043,213 B2 | 5/2006 | Robinson et al. |
| 7,061,327 B2 | 6/2006 | Doy |
| 7,061,328 B2 | 6/2006 | Doy |
| 7,106,135 B2 | 9/2006 | Makino et al. |
| 7,183,857 B2 | 2/2007 | Doy et al. |
| 2008/0088371 A1* | 4/2008 | You et al. | 330/251 |

FOREIGN PATENT DOCUMENTS

WO     WO 00/00983 A1     1/2000

OTHER PUBLICATIONS

MAX9730 2.4W, Single-Supply, Glass G Amplier, Dec. 2006, Maxim Integrated Products.

International Search Report PCT/US07/064546 dated Feb. 28, 2008.

International Search Report PCT/US07/064545 dated Feb. 28, 2008.

International Search Report PCT/US07/064543 dated Feb. 22, 2008.

* cited by examiner

HIGH EFFICIENCY AUDIO AMPLIFIER

CROSS-REFERENCES TO RELATED APPLICATIONS

The present application claims benefit under 35 USC 119 (e) of U.S. provisional Application No. 60/982,358, filed on Oct. 24, 2007, entitled "High Efficiency Audio Amplifier," the content of which is incorporated herein by reference in its entirety.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates to audio amplifiers, particularly audio amplifiers where efficiency is important, such as battery-operated portable applications, for example portable amplifiers connected to headphones.

Minimizing unnecessary amplifier power dissipation is important in portable applications, such as headphones with a battery operated amplifier, such as a portable music player or telephones. In portable music players, such as MP3 players, designs are leading to decreasing MP3 encoding power dissipation as small feature size processes are used for the digital sections. This leaves the headphone as a major power dissipation contributor. In cellular telephones, especially where MP3 functions are integrated, the percentage of the power dissipated compared to the power dissipated in the transmitter and receiver is small. However, the headphones are used for a much longer period of time, making accumulated battery drain important.

Often very large AC-coupling capacitors are used to allow ground-referenced headphone return paths, i.e., headphone connections, where one of the terminals is grounded. It is desirable to remove these large capacitors and to achieve high power efficiency.

In the past, audio amplifiers have employed bipolar power supplies for AB amplifiers with a reference voltage, typically ground reference, between high and low (positive and negative) voltage rails. However, in relatively low-cost, low-power applications, demands have made it far more costly to provide a negative power supply voltage than to add large AC-coupling capacitors.

Some types of audio amplifiers with bipolar power supplies employ an integrated negative-supply generating charge pump in order to make it more cost effective to include the negative power rail, thereby making ground-referenced headphones easier for customers to use. Known art uses a charge-pump to generate a negative rail.

Reference is made to U.S. Pat. Nos. 7,061,327, 7,061,328, and 7,183,857 for background. Referring to FIG. 1, the techniques described therein use inefficient class AB amplifiers 12, 14 that employ two fixed voltage rails 16, 18 at +VCC and −VCC) with a battery 20 (at +VCC=1.8 VDC from ground) and a charge pump 22 and therefore suffer from high power dissipation at the loads, which are stereo earphone speakers 24, 26 referenced to ground. (The power dissipation in a class AB amplifier with a sinusoidal signal is minimal at the zero crossing and at the peak but maximum at points in between.) An alternative scheme described therein uses a single fixed voltage rail, which is likewise inefficient and requires a coupling capacitor to couple a signal to a ground-referenced load.

Class G amplifiers are known in the art. Referring to FIG. 2, a conventional class G amplifier 30 employs two parallel class AB amplifiers 32, 34 operating with complementary fixed voltage rail pairs 36, 38 and 40, 42 with power supplies at different maximum voltages (e.g. 3.0 VDC and 2.25 VDC), where connection to the rails are alternately switched by an equivalent ganged switch 44 (such as transistor switches) during each power cycle so that each amplifier 32, 34 operates only during a segment of different parts of the power cycle. The proper selection of the cycle parts improves efficiency to the output load, a loudspeaker 46. To accommodate the d.c. voltage shift of the a.c. signal, a coupling capacitor 48 is needed.

It is important to consider how battery voltage maps into power supply requirements. For example, where a Li-Ion battery is used, the output voltage is a nominal 3.6V. However, producing +/−3.6V and the associated rails can be costly due to the high 7.2V requirements. Efficiency degrades when many rails are employed. Supplying the input voltage from the output of a +DC, −DC power source is possible but at added cost.

More efficient multiple-rail power supplies are needed.

SUMMARY OF THE INVENTION

According to the invention, an audio amplifier system for use with a single-ended portable power supply that is referenced to ground, such as a small battery, has a single-channel class G amplifier section, a multiple voltage output charge pump subsystem for supplying complementary pairs of power supply voltages at selected ratiometric levels to an amplifier section, a set of switches on the power supply rails and a power-measuring comparator for selecting which complementary pair of power supply voltages is provided to the amplifier section.

The invention will be better understood by reference to the following detailed description in connection with the accompanying drawings.

DETAILED DESCRIPTION OF THE INVENTION

Figure 1:
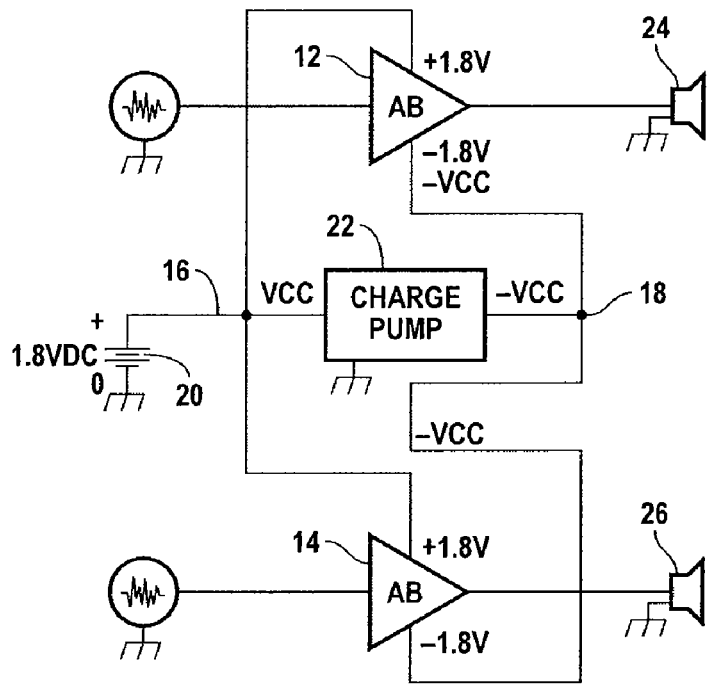
FIG. 1 is a block diagram of a prior art amplifier system.
Figure 2:
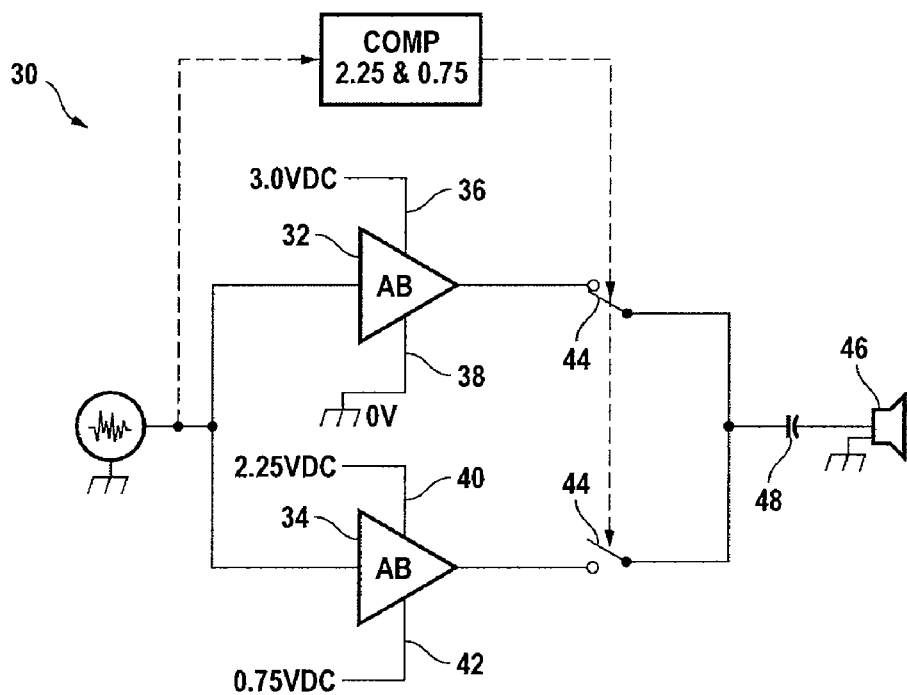
FIG. 2 is a block diagram of a prior art class G amplifier.
Figure 3:
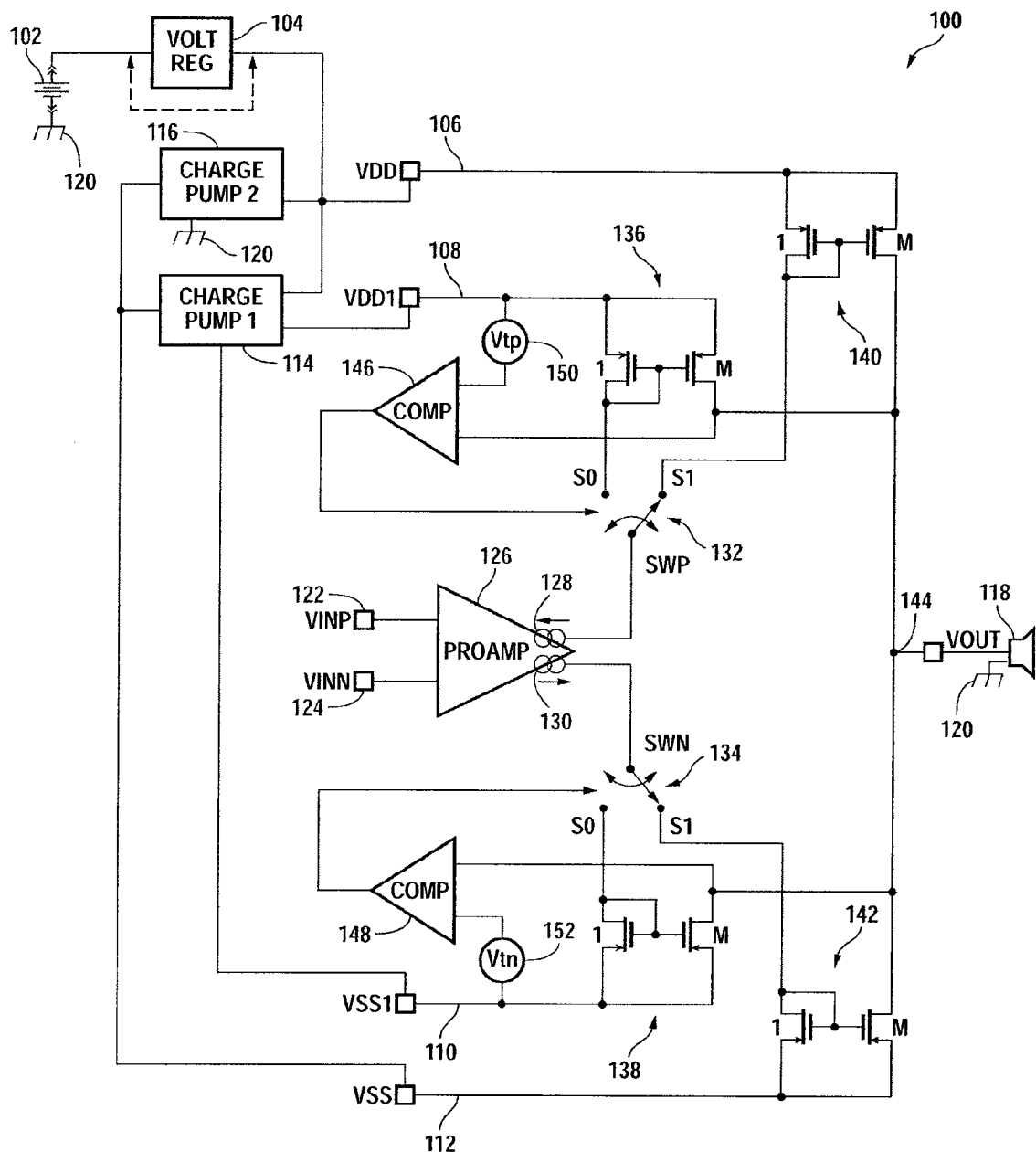
FIG. 3 is a schematic diagram of a first embodiment of the invention.
Figure 4:
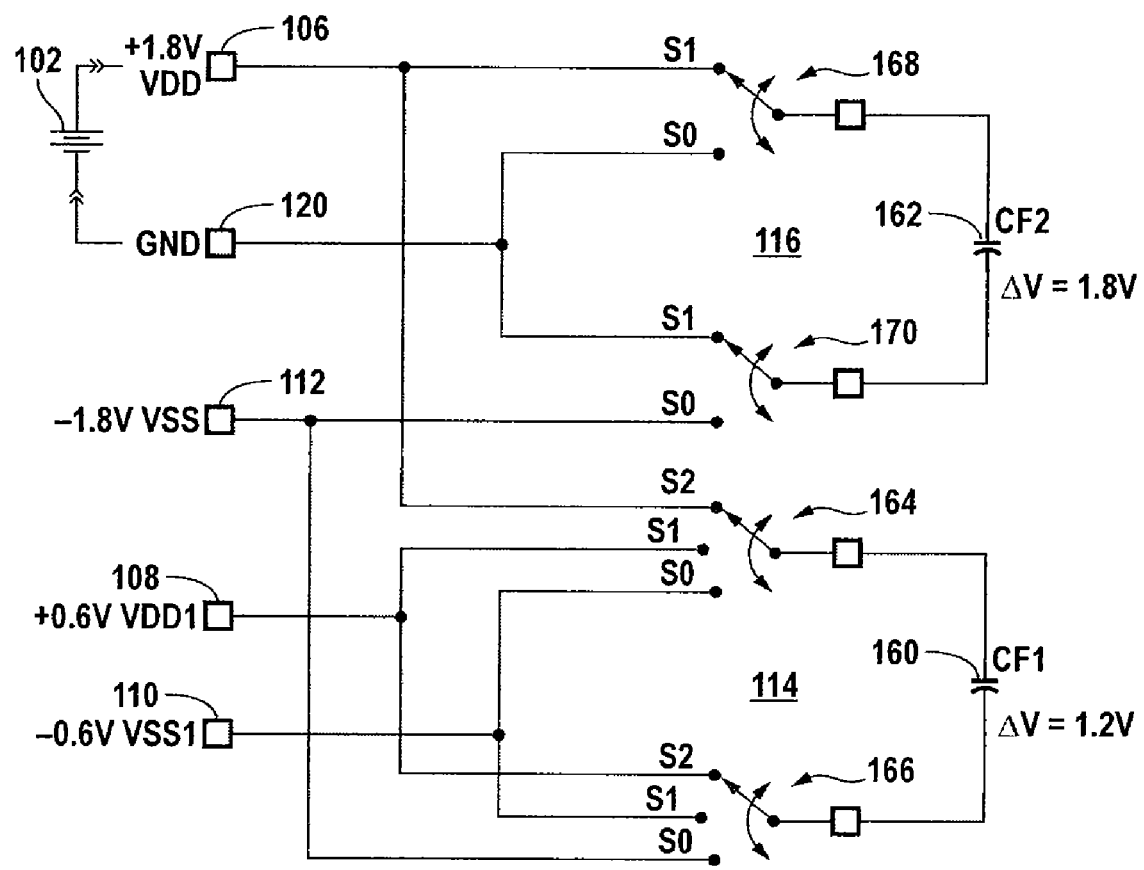
FIG. 4 is a schematic diagram of a charge pump subsystem employed in connection with the invention.

The present invention involves ground-reference class G amplifier solutions powered by a multiple-rail charge pump subsystem as shown in FIG. 3 and FIG. 4. These configurations yield the best results of both high power efficiency and no requirement for output capacitors. In the example of the circuit of FIG. 3, a class G amplifier system 100 operates with a battery power source 102 at a voltage VDD of 1.8V. There is an optional voltage regulator 104 to assure constancy. This is primarily employed where the source voltage is subject to unexpected variations or where there is sufficient headroom in the voltage source to permit a voltage drop in the regulator circuit. In direct connection, the battery 102 supplies the voltage to the VDD voltage rail 106 for an outer rail or power supply terminal, and ratio metrically related voltages are applied at inner rails VDD1, VSS1 and outer rail VSS, which are power supply terminals at voltages VDD1, −VSS1 and −VSS, respectively, that are in pairs of complementary voltages around ground (zero volts). Where VDD is at 1.8V, VSS is at −1.8V. Where VDD1 is set at 0.6V, VSS1 is at −0.6V. These voltages are produced by a charge pump subsystem consisting of charge pump 1 114 and charge pump 2 116 connected to the other rails 108, 110 and 112, as hereinafter explained. The battery and the output load, namely a loudspeaker or earphone 118, are both referenced to ground 120, as is the second charge pump 2 116. Significantly, there is no output capacitor to add inefficiencies and drain the battery. The charge pump subsystem may supply power to a plurality of amplifiers, as in a stereo system. Only one amplifier is shown in FIG. 3 for simplicity. It is also to be understood that VDD may be any voltage, not just 1.8V, although the VDD1 rail is selected to be at a ratiometric level in relation thereto, such as 1.2V or 0.6V, in accordance with charge pump design.

The class G amplifier 100 is coupled to receive and amplify a differential audio signal of VINP and VINN at differential input terminals 122, 124 of a preamplifier 126, which in turn generates differential current that is output through output terminals 128, 130. Two rail selector switches SWP 132 and SWN 134 direct whether the preamplifier 126 is connected through inner current mirrors 136, 138 to the inner rail pair 108, 110 (switch position S0) or through the outer current mirrors 140, 142 to the outer rail pair 106, 112 (switch position S1). The efficiency of the amplifier 100 is determined by the switching thresholds, as hereinafter explained.

The current mirrors 136, 138, 140, 142 are respectively coupled at their source terminals to the voltage rails VDD1, VSS1, VSS and VDD, whereas the drain terminals of each of their output stages M are all connected to the output node 144 that directly drives the load 118, as intended. The reference M indicates that there is a substantial amplification in comparison to the input stages of the current mirrors. The drain terminals of the input stages "1" of each of the current mirrors 136, 138, 140, 142 are respectively switched to current sources 128, 130, alternately activating inner current mirrors 136, 138 and outer current mirrors 140, 142 supplied respectively by the inner rails 108, 110 and the outer rails 106, 112.

The switches SWP 132 and SWN 134 are controlled by comparators 146, 148, which operate independently of one another. One input terminal of each comparator 146, 148 is coupled to the output node 144 to monitor instantaneous voltage at the output, one comparator 146 sensing for positive deviations from neutral reference and the other comparator 148 sensing for negative deviations. (In an alternative embodiment, the terminal of the comparators 146, 148 can be coupled to monitor, respectively input terminals 142 and/or 144 with appropriate modification of threshold requirements.) A positive voltage threshold element Vtp 150 is coupled between the inner rail VDD1 108 and the other input to the comparator 146. A negative voltage threshold element Vtn 152 is coupled between the inner rail VSS1 110 and the other input to the comparator 148. The respective threshold levels are selected to be approximately 150 mV. In operation, a positive voltage deviation (above ground reference) creating less than 150 mV between the voltage at output terminal 144 and inner rail VDD1 108 causes the comparator 146 to switch the switch 132 from position S0 to S1, that is from inner rail 108 to outer rail 106, permitting greater output voltage amplitude than is permitted by the inner rail 108. The reverse is also true to cause the switch 132 to change back from position S1 to S0, with some hysteresis.

Similarly, but independently, in operation, a negative voltage deviation (below ground reference) creating less than 150 mV between the voltage at output terminal 144 and inner rail VSS1 110 causes the comparator 148 to switch the switch 134 from position S0 to S1, that is from inner rail 110 to outer rail 112, permitting greater output voltage amplitude than is permitted by the inner rail 110. Thus efficiency is achieved for both low amplitude deviations and high amplitude deviations, depending upon instantaneous output voltage at the output node 144. The reverse is also true to cause the switch 132 to change back from position S1 to S0, with some hysteresis A suitable charge pump subsystem suitable for the circuitry of FIG. 3 is shown in FIG. 4. A charge pump works by charging a floating switched capacitor for a switching period, then connecting it in series with another voltage reference, such as another capacitor, or by reversing terminals, for a power supplying cycle. FIG. 4 illustrates charge pump 1 114 built on capacitor CF1 160 connected to charge pump 2 116 built on capacitor CF 162, all connected to voltage rails VDD 106, VDD1 108, GND 120, VSS1 110, VSS 112, where battery 102 is connected between VDD 106 and GND 120. the respective voltages produced from a 1.8V source are 1.8V, 0.6V, 0V, −0.6V and −1.8V. This is accomplished with charge pump 1 114 operative in three states and charge pump 2 116 operative in two states. This means that the charge pumps dwell in each state either one-third or one-half of each of their respective charge cycles. Charge pump 1 114 is provisioned with first and second ganged three-state switches 164, 166 that dwell in each of its states one-third of the time of a cycle. Switch 1 164 has terminal S2 connected to VDD, terminal S2 connected to VDD1 and terminal S0 connected to VSS1. Ganged switch 2 166 has its terminal S2 connected to VDD1 and its terminal S1 connected to terminal VSS1 and its terminal S0 connected to terminal VSS. In state S0, capacitor 160 is coupled across VSS and VSS1; in state S1, capacitor 160 is coupled across VDD1 and VSS1 and in state S2, capacitor 160 is coupled across VDD and VDD1.

Charge pump 2 116 is provisioned with third and fourth ganged two-state switches 168, 170 that dwell in each of its states one-half of the time of a cycle. Switch 168 in switch position S0 is connected to ground 120 and in switch position S1 is connected to VDD rail 106. Switch 170 in switch position S0 is connected to VSS rail 112 and in switch position S1 is connected to Ground. Thus switching between states S0 and S1 causes capacitor 162 to have its terminals alternately connected between ground and the rail VDD with the constant power supply voltage at VDD and the rail VSS that carries the inverse of the power supply voltage. The periods of dwell in each state is equal, so that charge pump 2 116 is reversing the sense of charged capacitor 162 each period of the charging or discharging of capacitor 160 of charge pump 1. Therefore, as configured, charge pump 1 produces a differential voltage of 1.2V across capacitor 160. This differential voltage is applied with proper polarity and voltage differential across voltage rails where that desired differential is maintained to yield the voltages at DC potential of 1.8V, 0.6V, 0V, −0.6V and −1.8V with sufficient charge to supply the amplifier circuit of FIG. 3.

Ratiometric spacings of 33% have been shown in the embodiment of FIG. 3. For example 33% spacings (VDD/3) are arranged to give 1.8V, 0.6V, −0.6V and −1.8V. Other ratiometric spacings are possible, such as 25%.

Other rail combinations are possible when a lithium-ion supply is considered. The Li-Ion supply is typically at 3.6V. A 3-state charge pump can produce +3.6V, 1.8V, 0V and also −1.8V. In such a case, the amplifier can be class AB running of +/−1.8V modified to a class G configuration. Alternatively, a 6-state charge pump supplied by a +3.6V supply can produce power outputs of +3.6V, 2.7V, 1.8V, 0.9V, 0V, −0.9V and −1.8V. Other combinations exist having different ratiometric relationships.

It is important to consider the actual signal to be amplified when selecting the rail options. The average power dissipation is related to the probability density function of the signal and the volume setting. Music and voice dictate different choices for selecting rail options.

The invention has been explained with reference to various embodiments. Other embodiments will be evident to those of skill in the art. It is therefore not intended that this invention be limited, except as indicated by the appended claims.

What is claimed is:

1. An audio amplifier system for use with a single-ended power supply that is referenced to ground, the amplifier system comprising:
   a charge pump subsystem coupled to be driven by said single-ended power supply and operative to generate a first complementary power supply voltage pair and a second complementary power supply voltage pair, including first and second power supply voltages that are positive, and third and fourth power supply voltages that are negative, for supplying all said power supply voltages to an amplifier section; and
   a class G amplifier section, said class G amplifier section comprising a single channel, said single channel having
      first and second power supply terminals coupled for alternately receiving said first and second power supply voltages,
      third and fourth power supply terminals coupled for alternately receiving said third and fourth power supply voltages,
      first switching means coupled to alternately switch between said first power supply voltage and said third power supply voltage;
      second switching means coupled to alternately switch between said second power supply voltage and said fourth power supply voltage;
      a first comparator operative to cause said first switching means to switch power upon sensing a power output voltage approaching a positive peak in excess of a first threshold; and
      a second comparator operative to cause said second switching means to switch power upon sensing a power output voltage approaching a negative peak in excess of a second threshold.

2. The audio amplifier system according to claim 1 wherein said first and second comparators are coupled to monitor amplifier output signal power for controlling power switching.

3. The audio amplifier system according to claim 1 wherein said comparator is coupled to monitor amplifier input signal power for controlling the switching.

4. The audio amplifier system according to claim 1 wherein said first and second positive power supply voltages are ratiometric and said third and fourth negative power supply voltages are ratiometric.

5. The audio amplifier system according to claim 1 wherein said charge pump subsystem further comprises a first charge pump having a first charge capacitor and a first charge switching network, and a second charge pump having a second charge capacitor and a second charge switching network, the first charge pump having a three state duty cycle and the second charge pump having a two-state duty cycle, wherein dwell time of all states in the duty cycles are substantially equal in duration, the first charge pump being coupled to the second charge pump so that charge the first charge capacitor and the second charge capacitor produce ratiometric voltages of at least two complementary voltage levels relative to ground.

6. An audio amplifier system for use with a single-ended power supply that is referenced to ground, the amplifier system comprising:
   a charge pump subsystem coupled to be driven by said single-ended power supply and operative to generate a first complementary power supply voltage pair, a second complementary power supply voltage pair, and a third complementary power supply voltage pair, including first, second and third power supply voltages that are positive, and fourth, fifth and sixth power supply voltages that are negative, for supplying all said power supply voltages to an amplifier section; and
   a class G amplifier section, said class G amplifier section comprising a single channel, said single channel having
      first, second and third power supply terminals coupled for intermittently receiving said first, second and third power supply voltages,
      fourth, fifth and sixth power supply terminals coupled for intermittently receiving said fourth, fifth and sixth power supply voltages,
      switching means coupled to switch among said first complementary power supply voltage pair, said second complementary power supply voltage pair and said third complementary power supply voltage pair; and
      a comparator operative to cause said switching means to switch power from said charge pump means to said amplifier section among said first complementary power supply voltage pair, said second complementary power supply voltage pair and said third complementary power supply voltage pair.

* * * * *